United States Patent
Shibata et al.

[11] Patent Number: 5,478,397
[45] Date of Patent: Dec. 26, 1995

[54] HEAT TREATING DEVICE

[75] Inventors: Toshimitsu Shibata, Yokohama; Toshiaki Miyaju, Kanagawa; Naoya Kaneda, Machida, all of Japan

[73] Assignees: Tokyo Electron Kabushiki Kaisha; Tokyo Electron Tohoku Kabushiki Kaisha, Japan

[21] Appl. No.: 258,066

[22] Filed: Jun. 10, 1994

[30] Foreign Application Priority Data

Jun. 14, 1993 [JP] Japan .................................. 5-167473

[51] Int. Cl.⁶ .................................. C23C 16/00
[52] U.S. Cl. .................. 118/724; 118/715; 118/725
[58] Field of Search .................. 118/715, 724, 118/725

[56] References Cited

U.S. PATENT DOCUMENTS

| | | | |
|---|---|---|---|
| 5,029,554 | 6/1991 | Miyashita | 118/715 |
| 5,146,869 | 9/1992 | Bohannon | 118/724 |
| 5,273,586 | 12/1993 | Kim | 118/723 E |
| 5,279,670 | 1/1994 | Watanabe | 118/725 |
| 5,308,955 | 5/1994 | Watanabe | 219/390 |
| 5,320,680 | 6/1994 | Learn | 118/724 |
| 5,370,371 | 12/1994 | Miyagi | 266/256 |

FOREIGN PATENT DOCUMENTS

| | | | |
|---|---|---|---|
| 0140413 | 6/1987 | Japan | 118/715 |
| 0073625 | 3/1990 | Japan | 118/724 |
| 6-204157 | 7/1994 | Japan . | |
| 5-343342 | 12/1994 | Japan . | |

*Primary Examiner*—R. Bruce Breneman
*Assistant Examiner*—Jeffrie R. Luno
*Attorney, Agent, or Firm*—Beveridge, DeGrandi, Weilacher & Young

[57] ABSTRACT

A heat treating device including a processing vessel for exposing objects to be treated (e.g., semiconductor wafers) held in a wafer boat for a heat treatment, processing gas introduction nozzles for introducing processing gases, a cap for openably closing tightly an opening of the processing vessel; a heat retention cylinder on which the boat is mounted; and a gas introduction opening, a gas passage, and a gas release opening opened in the heat retention cylinder. Processing gases introduced from the introduction nozzles are taken into the heat retention cylinder through the gas introduction opening and released radially from the gas release opening in the top thereof. The heat retention cylinder has the function of introducing the processing gases, whereby high intra-plane film thickness uniformity can be retained without rotating the wafer boat.

3 Claims, 5 Drawing Sheets

HEAT TREATING DEVICE

BACKGROUND OF THE INVENTION

The present invention relates to a heat treating device, such as a vertical CVD device.

Heat treating devices are generally used as devices for conducting required heat treatments on objects to be treated, such as semiconductor wafers, in uniform temperature states, for forming thin films on the surfaces of the objects and for carrying out thermal diffusion thereon.

FIG. 9 is a vertical sectional view of one example of the conventional vertical heat treating devices. A heat treatment furnace 2 comprises a processing vessel 8 including an inner tube 4 of quartz having the top and the bottom opened, and an outer tube 6 of quartz concentrically spaced from the outer circumference of the inner tube by a set distance, and having a ceiling 6A and an opened bottom. A heater (not shown) is disposed around the outer circumference of the processing vessel 8.

The inner and the outer tubes 4, 6 have respective lower ends supported by a manifold 10 of, stainless steel. Processing gas feed nozzles 12 for introducing processing gases are horizontally inserted into the interior of the manifold 10, and an exhaust pipe 14 is connected to the manifold 10 for evacuating the interior of the processing vessel 8. The processing gas introduced into the processing vessel 8 ascends in the inner tube 4 and descends between the inner and the outer tubes 4, 6 to be discharged outside through the exhaust pipe 14.

A wafer boat 16 with a number of semiconductor wafers W as objects to be treated mounted horizontally spaced from each other in the longitudinal direction of the wafer boat of, e.g., quartz is loaded into the inner tube 4. The wafer boat 16 is placed on the top of a heat retention cylinder 18 of quartz having the interior filled with heat insulating glass wool.

The lower end opening of the manifold 10 is openably made air-tight by a disk-shaped cap 20 through an O-ring 22. The cap 20 is supported on a rotary shaft 28 provided on an arm 26 of lift means 24, such as an elevator, through a magnetic seal 30. A ring 32 for receiving the heat retention cylinder 18 is secured to the upper end of the rotary shaft 28, and the above-mentioned heat retention cylinder 18 is provided on the rotary shaft 28. The rotary shaft 28 is rotated through a pulley 34 by a power belt 36 of a motor (not shown).

During heat treatment of the objects to be treated, the rotary shaft 28 is rotated by the motor to rotate the wafers W on the wafer boat 16 while the wafers W are being exposed to ascending processing gases, whereby intra-plane uniformity of deposited films on the surfaces of the wafers can be made as high as possible.

When the wafers W are loaded into/unloaded out of the processing vessel 8, the lift means 24 is driven to move up together the cap 20, the heat retention cylinder 18 and the wafer boat 16 to load/unload the wafers into/out of the processing vessel 8.

In the devices of the above-described conventional structure, the wafer boat 16 of FIG. 9 has to be rotated during a heat treatment so as to secure uniform heating, specifically intra-plane uniformity of, e.g, a deposition, especially uniform treatment between those of the wafers loaded at the central parts of the wafer boat and those at the bottom thereof. To this end, a rotary mechanism is needed, and because heat treatments are conducted in vacuum states, the magnetic seal 30 which functions, while securing the seal, as the bearing for permitting the rotation of the rotary mechanism has to be used. This makes the structure more complicated, which is a factor for high costs. This is one problem with the conventional heat treating devices.

Furthermore, because magnetic fluid used in the magnetic seal 30 is relatively vulnerable to heat, it is necessary to provide a water cooling pipe or other means (not shown) in the arm 26 of the elevator 24 to cool the magnetic seal 30. This makes the structure more complicated, which is a factor for high costs.

The cooling pipe or other means cools the surrounding of the cap 20 containing the magnetic seal 30 to a lower temperature relative to the other parts, and depositions of the processing gases tend form on the surrounding. The depositions peel off and float as particles, which contaminate the wafers. This is also a problem.

Furthermore, although the magnetic fluid used in the magnetic seal 30 is cooled, the magnetic fluid reacts with the processing gases, and its sealing ability is gradually degraded. A resultant problem is the magnetic fluid leaks from the magnetic seal 30. Maintenance inspection thereof is needed every 3 to 6 months.

SUMMARY OF THE INVENTION

In view of the above-described problems, the present invention was made to effectively solve the problems. An object of the present invention is to provide a heat treating device which includes a heat retention cylinder having the function of introducing processing gases, whereby high intra-plane uniformity of a film thickness can be retained high without rotating a wafer boat with objects to be treated mounted on.

To solve the above-described problems, the heat treating device according to the present invention comprises an object to be treated boat for holding objects to be treated; a processing vessel including an inner tube for receiving the objects to be treated boat to expose the objects to be treated to processing gases for a heat treatment, an outer tube disposed conically with the inner tube and spaced from the inner tube by a set gap, and an opening in the bottom; processing gas introduction nozzles inserted in the interior of the processing vessel for introducing processing gases; a cap being vertically movable for openably closing the opening of the processing vessel tightly; and a heat retention cylinder which is connected to the cap, and on which the objects to be treated boat is to be mounted, the heat retention cylinder having a gas passage formed therein, a gas introduction opening formed near the forward ends of the gas introduction nozzles, and a gas release opening formed in the top thereof.

In the present invention of the above-described structure, the heat retention cylinder is unrotatably secured directly to the cap. The gas passage is formed in the heat retention cylinder, and the gas introduction nozzles are opposed near the gas introduction opening. Thus, processing gases from the gas introduction nozzles enter the heat retention cylinder at the gas introduction opening substantially without leaking to the surroundings, ascend in the gas passage in the heat retention cylinder and evenly flow out from the gas release opening to its periphery.

Thus, the fed processing gases substantially evenly ascend around the wafer boat mounted on the upper end of the heat retention cylinder, whereby intra-plane uniformity of depositions on the objects to be treated can be retained high without rotating the boat.

DETAILED DESCRIPTION OF PREFERRED EMBODIMENTS

The heat treating device according to one embodiment of the present invention will be explained with reference to the drawings attached hereto.

Figure 1:
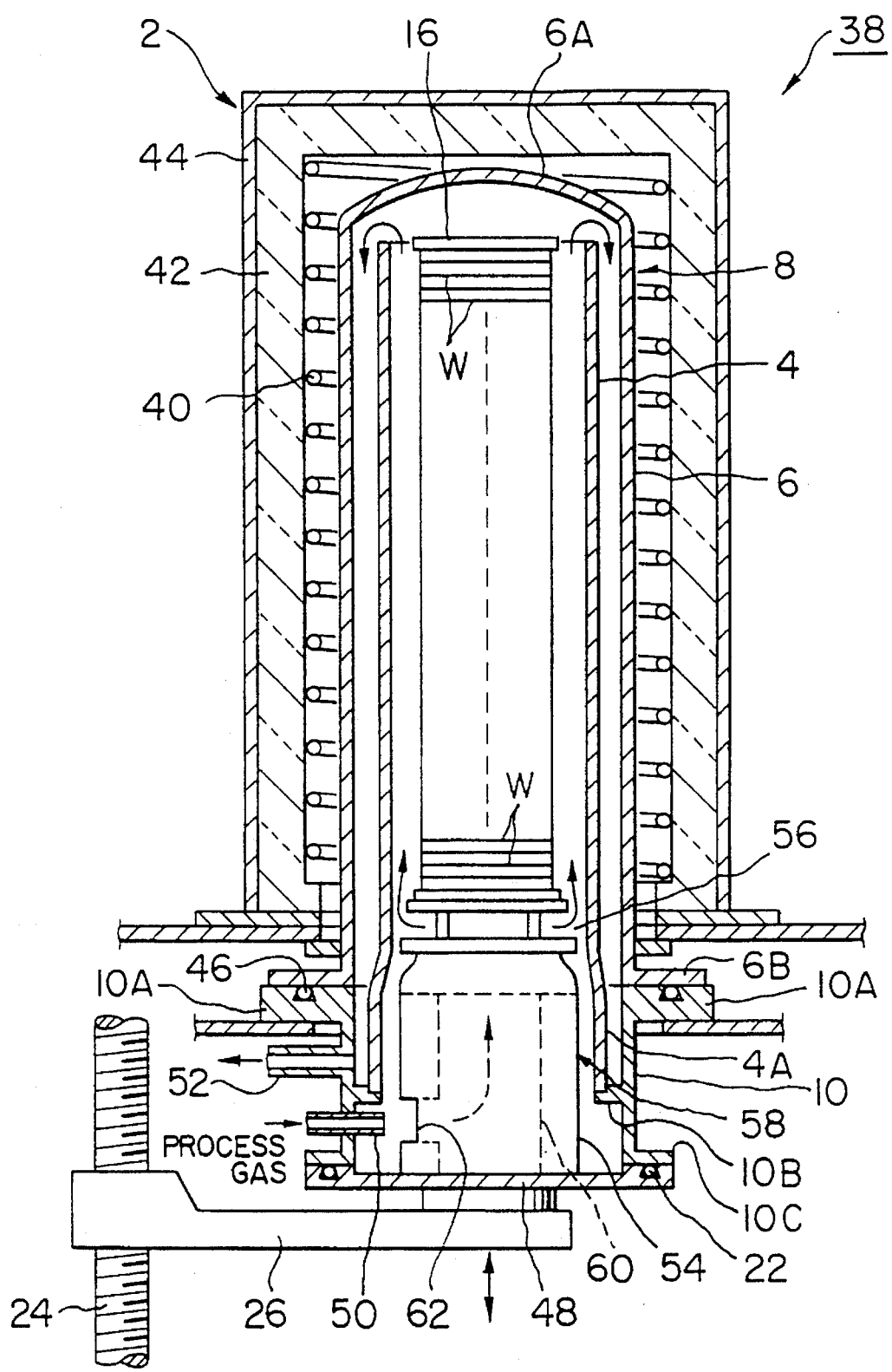
FIG. 1 is a vertical sectional view of the heat treating device according to one embodiment of the present invention.

As shown in FIG. 1, a heating furnace 2 of a CVD device 38 comprises an inner tube 4 of quartz having the top and the bottom opened, and an outer tube 6 of quartz concentrically spaced from the outer circumference of the inner tube by a set distance, and having a ceiling 6A and the bottom opened, and a resistance heater 40, for example, is wound on the outer circumference of the processing vessel 8. An outer shell 44 of, e.g., stainless steel is provided around the outer circumference of the heater formed by a heat insulating material 42. These members constitute the heating furnace 2. The heater 40 is controlled to set the interior of the processing vessel 8 suitably within, e.g., a range of 50°–1200° C.

A wafer boat 16 of, e.g., stainless steel for mounting objects to be treated is loaded in the inner tube 4. A number of objects to be treated, e.g., semiconductor wafers W are removably horizontally mounted and spaced from each other at a set vertical pitch.

A cylindrical manifold 10 of, e.g., stainless steel is connected to the lower ends of the inner and the outer tubes 4; 6. An upper ring-shaped flange 10A is formed on the upper end of the manifold 10, and a flange 6B of the outer tube 6 is air-tightly positioned on the upper flange 10A through an O-ring 46.

A middle ring-shaped flange 10B is projected inward from a middle portion of the manifold 10. The middle flange 10B bears the inner tube 4 with a lower end portion thereof a little more diametrically expanded than a inner tube receiving ring. A lower ring-shaped flange 10C is projected outward from the lower end of the manifold 10, and openably air-tightly contacts a cap 48 of, e.g., stainless steel through an O-ring 22 at the opening of the processing vessel.

Processing gas introduction nozzles 50 are horizontally inserted in the manifold 10 for introducing processing gasses into the processing vessel, and an exhaust pipe 52 connected to a vacuum pump (not shown) for evacuating the interior of the processing vessel is connected to the processing vessel. The forward ends of the introduction nozzles 50 are located at a lower part in the inner tube 4, and the exit of the exhaust pipe 52 is in communication with a gap between the inner and the outer tubes 4; 6, so that introduced processing gases ascend in the inner tube 4 and descend in the gap between both tubes 4; 6 to be discharged through an exhaust pipe 52. One introduction nozzle or a plurality of introduction nozzles 50 are circumferentially juxtaposed with each other, so that plural kinds of processing gases can be concurrently fed in accordance with an intended deposition.

The wafer boat 16 is placed on the heat retention cylinder 54 through a spacer member 56 of, e.g., quartz. The heat retention cylinder 54 is fixedly supported directly on the cap 48 of, e.g., stainless steel which air-tightly seals through an O-ring 22 the opening of the manifold 10, which is the opening of the processing vessel.

The cap 48 moves with the whole wafer boat 16 up and down into and out of the processing vessel 8 by the drive of the lift means 24, e.g., an elevator or others, secured to the forward end of an arm 26 of the lift means 24.

Figure 2:
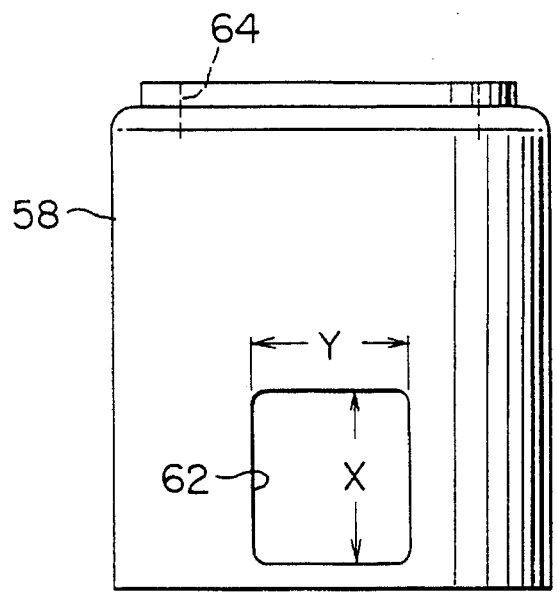
FIG. 2 is a side view of a heat retention cylinder cover used in the heat treating device of FIG. 1.
Figure 3:
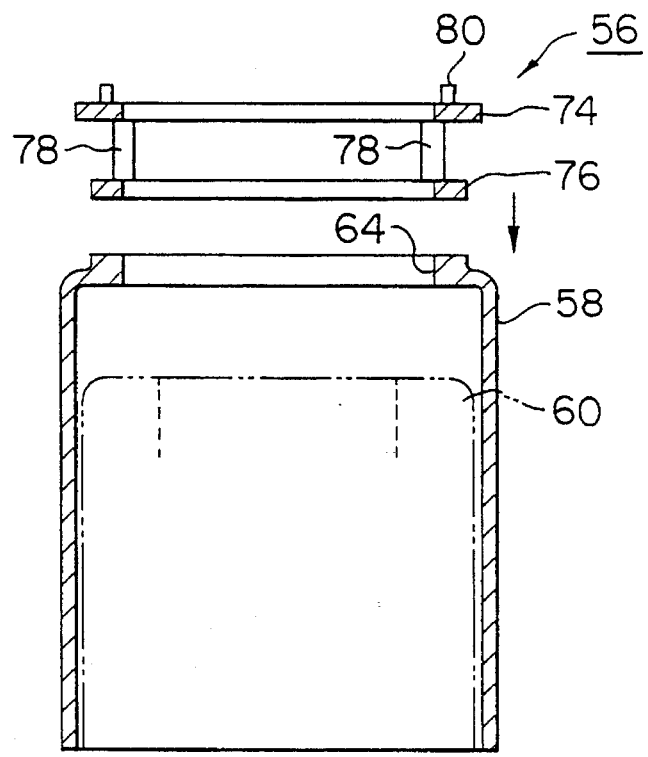
FIG. 3 is a vertical sectional view of the heat retention cylinder cover of FIG. 2 and a spacer.
Figure 4:
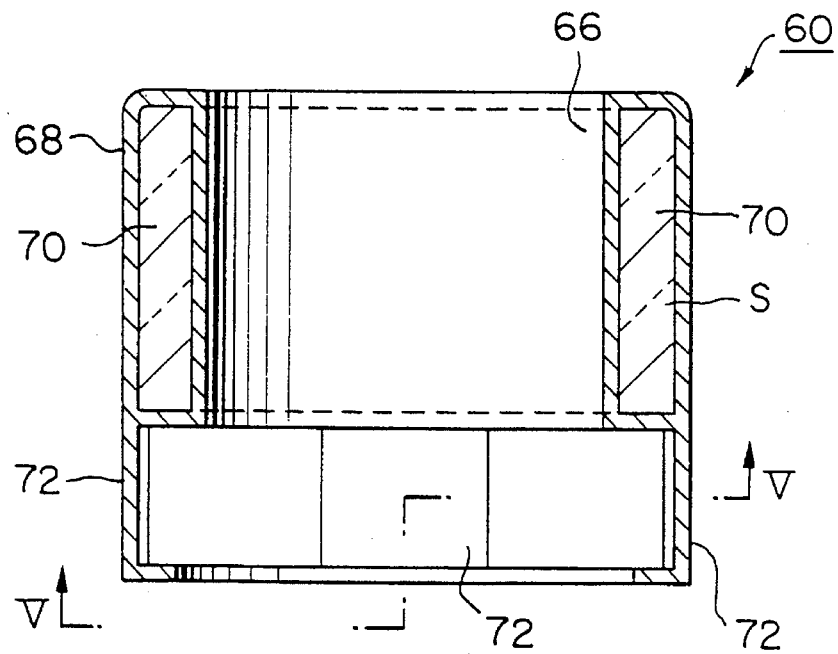
FIG. 4 is a vertical view of a heat reserving cylinder accommodated in the heat retention cylinder cover of FIG. 2.
Figure 5:
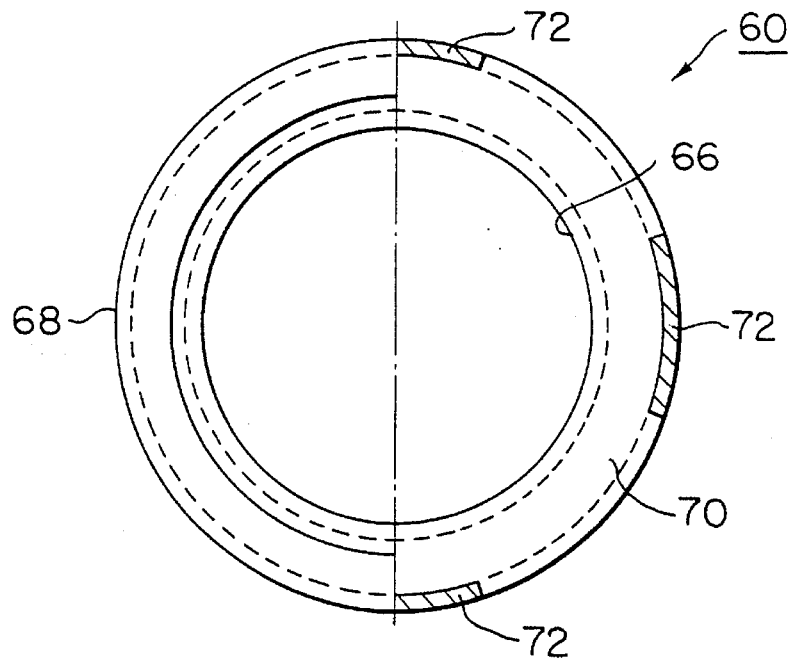
FIG. 5 is a right half broken cross-sectional view of the heat reserving cylinder of FIG. 4 along the line V—V.

The heat retention cylinder 54 comprises a cylindrical heat retention cylinder cover 58 of quartz as shown in FIGS. 2 and 3, and a heat reserving cylinder 60 of quartz disposed inside the heat retention cylinder cover 58 as shown in FIGS. 4 and 5.

As shown in FIGS. 2 and 3, a substantially rectangular gas introduction opening 62 is formed in a lower part of the side wall of the heat retention cylinder cover 58, and a gas release opening 64 is formed substantially in the entire top thereof. As shown in FIG. 1, the forward ends of the processing gas introduction nozzles 50 are inserted in the manifold 10 as near to the gas introduction opening 62 as possible so as not to interfere with the wafer boat 16 when the wafer boat 16 is loaded and unloaded. Processing gases introduced through the nozzles 50 can be taken into the heat reserving cylinder 60 through the gas introduction opening 62.

As shown in FIG. 1, an outer diameter of the heat retention cylinder cover 58 is set so as to be as near to the inside of the wall of the diametrically expanded lower end portion 4A of the inner tube 4 as possible, so that a gap between both is minimized to suppress as much as possible an amount of leaking processing gasses which do not enter the gas introduction opening 62. The gas release opening 64 is formed in a circle having the center in register with the central axis of the cover so that the processing gases can be released evenly in the circumferential direction of the gas release opening 64.

As shown in FIGS. 4 and 5, the heat reserving cylinder 60 accommodated in the heat retention cylinder cover 58 has a ring-shaped heat reserving portion 68 having a gas passage 66 in the center. The heat reserving portion 68 is formed in a tightly closed space S tightly surrounded by quartz. The space S is filled with a heat insulating material, e.g., glass wool 70, so that heat on the side of the wafer boat 16 is conducted to the side of the cap 48 as little as possible. Four, for example, legs 72 of quartz are erected at a set circumferential interval and function as pillars for supporting the whole device.

The legs 72 have a height equal to or larger than that of the gas introduction opening 62 of the heat retention cylinder cover 58, and a spacing between adjacent ones of the legs 72 is equal to or larger than a width of the gas introduction opening 62 so that inflow of the introduced gasses is not hindered. The heat reserving cylinder 60 is positioned in the heat retention cylinder cover 58 so that the spacing between adjacent ones of the legs 72 of the heat reserving cylinder 60 corresponds to the gas introduction opening 62 of the heat retention cylinder cover 58, so that the processing gases introduced through the gas introduction opening 62 is caused to ascend through the gas passage 66 and is released upward through the gas release opening 64 of the heat retention cylinder cover 58.

A number of the legs 72 is not limited to 4, and the legs 72 may be any number and arranged as long as they do not hinder flow of the introduced gases.

As shown in FIG. 3, a spacer 56 disposed on the top of the heat retention cylinder cover 58 is generally formed of, e.g., quartz and comprises a boat receiving ring 74 for receiving the lower end of the wafer boat 16, and a heat retention cylinder receiving ring 76 positioned below the ring 74. Both rings 74; 76 are interconnected by a plurality of, e.g., four, some centimeters-length pillars 78. A ring-shaped engagement convexity 80 to be engaged with the lower end of the wafer boat 16 is projected from the upper surface of the boat receiving ring 74.

With the heat retention cylinder receiving ring 76 placed on the upper end of the peripheral edge of the gas release opening 64 of the heat retention cylinder cover 58, the processing gases which have passed upward through the gas release opening 64 evenly spread radially outward of the wafer boat 16 and then flow between both rings 74, 76, and ascend in the inner tube 4.

Figure 6:
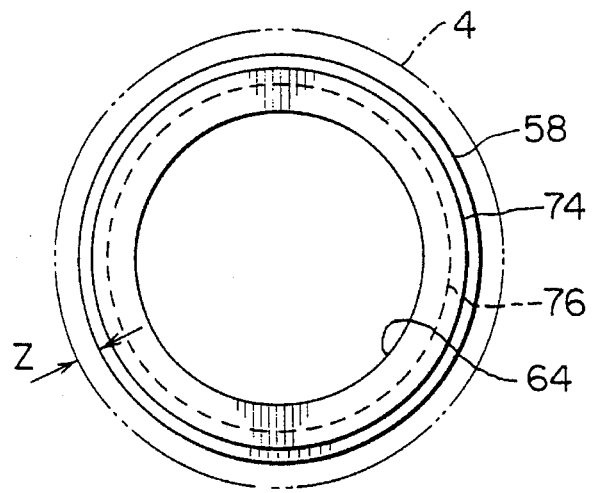
FIG. 6 is a view explanatory of a positional relationship between the heat retention cylinder of FIG. 2 and an inner tube.

FIG. 6 shows relationships among sizes of the boat receiving ring 74 of the spacer member 56 of FIG. 3, those of the heat retention cylinder cover 58, and those of the inner tube 4. That is, it is preferable that a total area of the boat receiving ring 74 is equal to or a little larger than an area of the opening of the heat retention cylinder cover 58. It is preferable that a sectional area of a gap between the inner wall of the inner tube 4 and the heat retention cylinder cover 58 is as small as possible for hindering the processing gases from the processing gas introduction nozzles 50 from leaking without entering the heat retention cylinder 54.

Furthermore, to suppress a leaking amount of the processing gases as described above, it is preferable to give an area S2 of the gas introduction opening 62 by the following formula $$S2 < (2X+Y) \times Z$$

where a height and a width of the gas introduction opening 62 are represented respectively by X and Y as in FIG. 2, and a spacing between the heat retention cylinder cover 58 and the inner tube 4 is represented by Z as in FIG. 6.

That is, an area S2 of the gas introduction opening 62 is equal to or larger than a sectional area of a gap defined between the periphery of the gas introduction opening and the inner tube.

In the case where a plurality of the processing gas introduction nozzles 50, e.g., for two kinds of processing gases are necessary, and two processing gas introduction nozzles are juxtaposed with each other, a width Y of the gas introduction opening 62 is set to be larger than a spacing between the two nozzles so as to take the processing gases effectively into the heat retention cylinder 54.

Next, the operation of the heat treating device according to the embodiment of the present invention will be explained.

First, as shown in FIG. 1, the wafer boat 16 holding a number of semiconductor wafers W at a set vertical pitch is lifted by the lift means 24 into the processing vessel 8, and the opening of the manifold 10 is closed by the cap 48 to air-tightly close the processing vessel 8.

The interior of the processing vessel is evacuated by a vacuum pump (not shown) through the exhaust pipe 52 to establish a required pressure, e.g., 0.5 Torr therein. The interior of the processing vessel 8 is heated up to a required temperature, e.g., 800° C. by the heater 40.

Then set amounts of processing gases are fed into the processing vessel 8 through the processing gas introduction nozzles 50. The processing gases from the processing gas introduction nozzles 50 enter the heat retention cylinder 54 and ascend in the gas passage 66 of the heat reserving cylinder 60. The processing gases which have passed through the gas passage 66 are released upward through the gas release opening 64 in the top of the heat retention cylinder cover 58, and flow radially outward, i.e., radially horizontally between the boat receiving ring 74 of the spacer member 56 and the heat retention cylinder receiving ring 76. Further, the processing gases which have passed here ascend through a gap between the outer circumference of the boat receiving ring and the inside surface of the inner tube 4 and flow into the wafer region. The processing gases which have passed through the wafer region flow to the ceiling 6A of the processing vessel 8, and next flow downward in the outer gap to the lower portion of the processing device and are exhausted outside through the exhaust pipe 52.

Different from the conventional device, in this embodiment the wafer boat 16 is not rotated but fixed. But the processing gases evenly flow radially from the gas release opening 64. Accordingly the processing gases evenly flow circumferentially over the wafers W in the wafer boat 16. As a result, without rotating the wafers, as is done in the conventional device, intra-plane uniformity of depositions, etc. can be maintained high.

Since the outerwall of the heat retention cylinder cover 58 and the inner wall of the inner tube 4 are as close to each other as possible, an amount of leakage of the processing gases which does not enter the gas introduction opening 62 can be made small, and intra-plane uniformity of the depositions, etc. are not impaired. That is, the processing gases flowing around the outside of the heat retention cylinder 54 can be reduced.

In depositing polysilicon films and TEOS films, one kind of processing gas is usually used, and the following arrangement is not necessary. But in a case where two kinds of processing gases, dichlorosilane and ammonium are concurrently used, e.g., in depositing SiN (silicon nitride) films, two processing gas introduction nozzles 50 are used. In such case, two nozzles 50 are horizontally juxtaposed with each other, and the forward ends of both nozzles are opposed to the gas introduction opening 62. Accordingly both processing gases from the two nozzles 50 can be effectively taken into the heat retention cylinder 54.

One hundred twenty-seven sheets of wafers of 100 sheets of 8-inch wafers and dummy wafers were subjected to processing to deposit SiN on the surfaces of these wafers. Their intra-plane film thickness uniformity was as follows.

At the top, i.e., the 11th sheet from the top had a ±2.1% intra-plane uniformity and the 36th sheet had a ±1.9% intra-plane uniformity. At the center, i.e., the 61st sheet had a ±1.9% intra-plane uniformity and the 86th sheet had a ±1.7% intra-plane uniformity. At the bottom, i.e., the 111th sheet had a ±2.1% intra-plane uniformity. Substantially the same good intra-plane uniformity as by the conventional heat treating device of the type that wafers are rotated could be secured.

Thus it is not necessary to rotate the wafer boat during a treatment. Accordingly rotary mechanisms, magnetic seals, etc. which are needed in the conventional devices can be omitted. The device itself can be simple.

Water cooling mechanisms are, not necessary either. Accordingly the cap 48 is not cooled, with a result that generation of depositions on this part can be suppressed, and accordingly generation of particles can be precluded without contamination.

Figure 7:
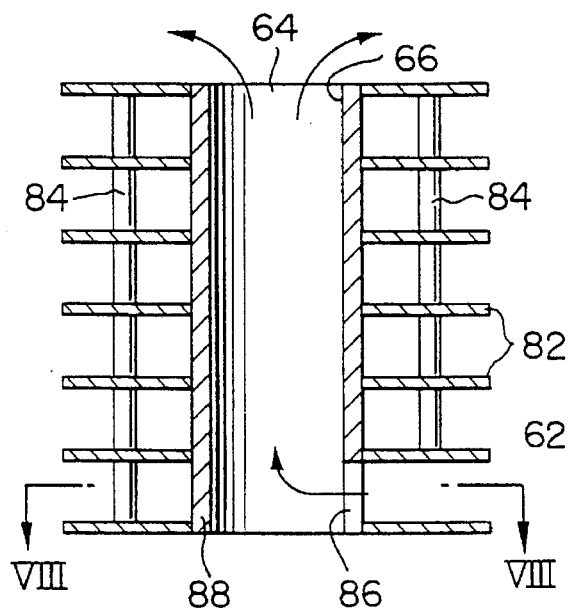
FIG. 7 is a vertical sectional view of one variation of the heat retention cylinder of FIG. 2.
Figure 8:
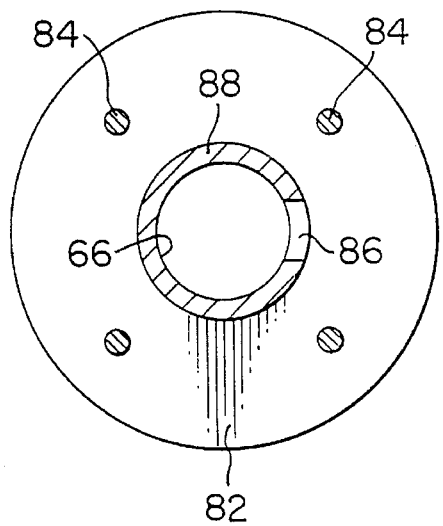
FIG. 8 is a cross-sectional view of the heat retention cylinder of FIG. 7 along the line VIII—VIII.
Figure 9:
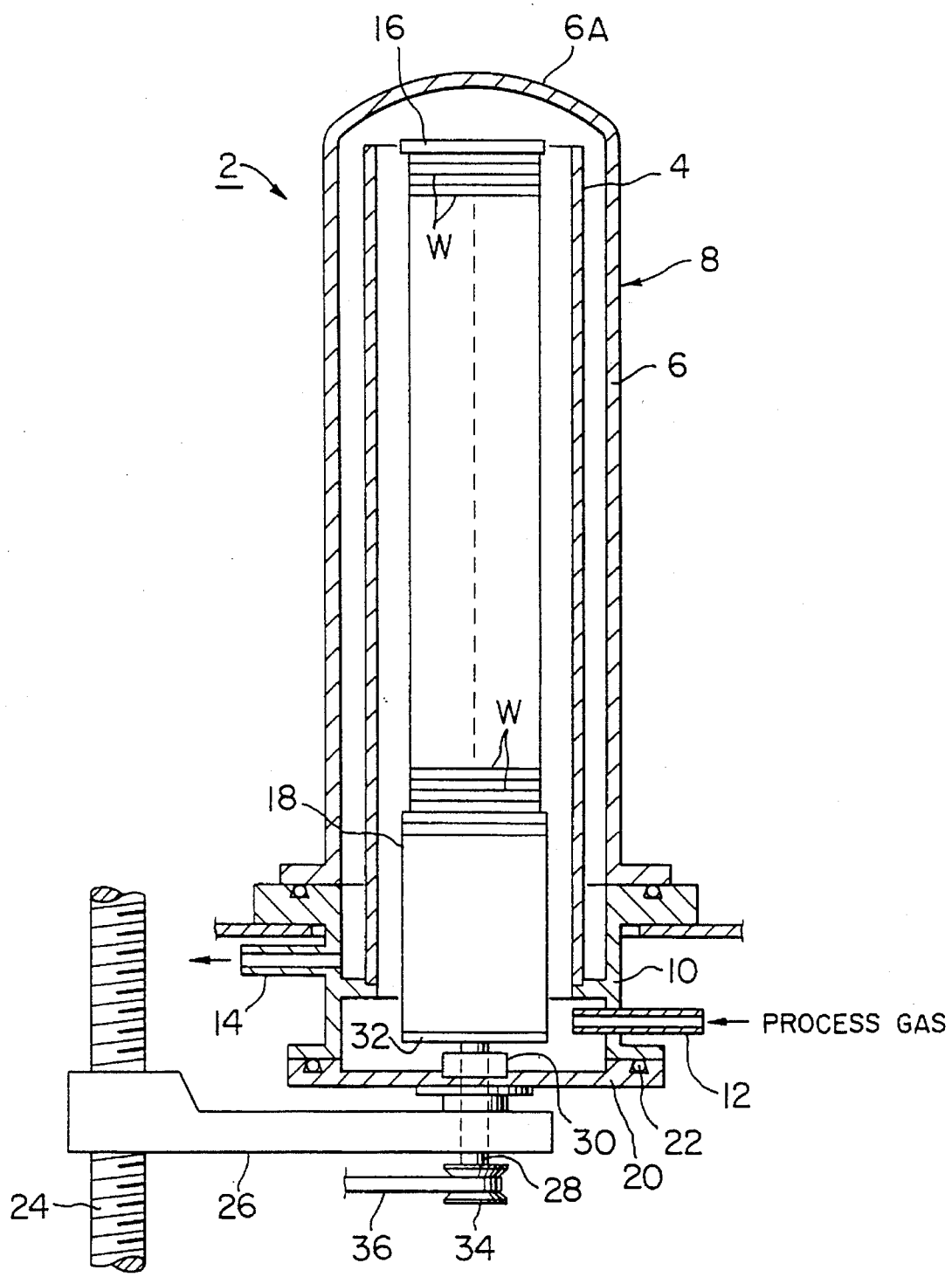
FIG. 9 is a vertical sectional view of the conventional heat treating device.

In the above-described embodiment the heat retention cylinder 54 is of the covered type having a cover, but instead may be of the so-called fin type, as shown in FIGS. 7 and 8, comprising a plurality of quartz rings 82 laid at a set vertical pitch by means of support rods 84 provided between each of the quartz rings and its adjacent one. In this case, the processing gas introduction opening 62 is provided by a part of the space between the lowermost two quartz rings 82, and a cylinder 88 of quartz is provided, as the gas passage 66 through the center of the respective quartz regions 82. A part of the cylinder 88 corresponding to the gas introduction opening 62 is cut out in an opening 86.

In this case as well, processing gases introduced through the gas introduction opening 62 enter the gas passage 66 through the opening 86, ascend in the gas passage 66 and evenly flow radially outward from the gas release opening 64 in the top, whereby the same advantageous effect as in the above-described embodiment can be achieved. It should be noted, however, that cylinder 88 may be omitted from this embodiment.

The above-described embodiment has been explained by means a low-pressure CVD device. But the present invention is not limited to low-pressure CVD devices and is applicable to any heat treating devices, such as atmospheric CVD devices, etc., which use heat reserving cylinders.

As described above, the heat treating device according to the present invention can achieve the following good advantageous effects.

Since processing gases are introduced through the best reserving cylinder, intra-plane uniformity of objects to be treated can be retained high without rotating the wafer boat holding the objects to be processed.

Accordingly rotation mechanisms for the wafer boat, and magnetic seals, etc. which are needed by the conventional devices are not necessary under the present invention. Accordingly simple structures can be obtained, and their costs can be lowered.

No magnetic seal is necessary. Accordingly no leakage of processing gases due to deterioration of magnetic fluid occurs.

Cooling means for the magnetic fluid is not necessary. Accordingly depositions are not easily formed on the cap, and generation of particles caused by the depositions can be suppressed.

What is claimed is:

1. A heat treating device comprising:

a wafer boat for holding objects to be treated;

a processing vessel including an inner tube for receiving the wafer boat to expose the objects to be treated to processing gases for a heat treatment, and an outer tube disposed concentrically with the inner tube and spaced from the inner tube by a set gap, the processing vessel defining an opening at a bottom thereof;

processing gas introduction nozzles inserted into the interior of the processing vessel for introducing processing gases into the processing vessel;

a vertically movable cap for openably closing the opening of the processing vessel; and a heat retention cylinder connected to the cap, on which the wafer boat may be mounted, the heat retention cylinder having a heat reserving cylinder body including a ring-shaped heat reserving portion defining a gas passage in the center thereof and a plurality of legs provided on an underside of the ring-shaped heat reserving portion, and a heat retention cylinder cover covering the heat reserving cylinder body, the heat retention cylinder cover defining therein a gas introduction opening proximal at least one of the gas introduction nozzles, and a gas release opening at a top of the heat retention cylinder cover, the gas introduction opening being connected to the gas release opening the gas passage formed in the center of the ring-shaped heat reserving portion.

2. The heat treating device according to claim 1, wherein the gas release opening is formed so as to release processing gases evenly in the circumferential direction of the heat retention cylinder.

3. The heat treating device according to claim 1, wherein a spacer member is disposed on an upper surface of the heat retention cylinder, the spacer member including a wafer boat receiving ring and a heat retention cylinder receiving ring connected to the boat receiving ring by a plurality of support rods.

\* \* \* \* \*